US012162746B1

(12) United States Patent
Milanovic

(10) Patent No.: US 12,162,746 B1
(45) Date of Patent: Dec. 10, 2024

(54) MEMS ACTUATORS HAVING A PHYSICAL GAP FILLED WITH FLUID

(71) Applicant: Mirrorcle Technologies, Inc., Richmond, CA (US)

(72) Inventor: Veljko Milanovic, Richmond, CA (US)

(73) Assignee: MIRRORCLE TECHNOLOGIES, INC., Richmond, CA (US)

( * ) Notice: Subject to any disclaimer, the term of this patent is extended or adjusted under 35 U.S.C. 154(b) by 263 days.

(21) Appl. No.: 17/551,661

(22) Filed: Dec. 15, 2021

Related U.S. Application Data

(60) Continuation of application No. 17/410,766, filed on Aug. 24, 2021, which is a division of application No. 15/882,859, filed on Jan. 29, 2018, now Pat. No. 11,111,133.

(60) Provisional application No. 62/451,943, filed on Jan. 30, 2017.

(51) Int. Cl.
*B81B 7/00* (2006.01)
*B81B 3/00* (2006.01)
*G02B 26/08* (2006.01)

(52) U.S. Cl.
CPC .......... *B81B 7/0051* (2013.01); *B81B 3/0035* (2013.01); *G02B 26/085* (2013.01); *B81B 2201/042* (2013.01)

(58) Field of Classification Search
CPC ...... B81B 7/0019; B81B 7/0035–0041; B81B 7/0048; B81B 7/0051; B81B 2201/042; B81B 3/0062; B81B 2203/0136; G02B 26/0816; G02B 26/0833; G02B 26/0841; G02B 26/085; G02B 26/101
See application file for complete search history.

(56) References Cited

U.S. PATENT DOCUMENTS

| 5,405,808 | A | 4/1995 | Rostoker et al. |
| 5,650,915 | A | 7/1997 | Alfaro et al. |
| 6,481,570 | B1 | 11/2002 | Henshall et al. |
| 6,495,944 | B2 * | 12/2002 | Hirano .............. H02N 1/008 |
| | | | 310/309 |
| 6,612,029 | B2 * | 9/2003 | Behin .............. B81B 3/0021 |
| | | | 359/254 |
| 6,639,313 | B1 | 10/2003 | Martin et al. |
| 6,666,561 | B1 | 12/2003 | Blakley |

(Continued)

FOREIGN PATENT DOCUMENTS

| EP | 2453570 A3 | 4/2018 |
| WO | 2009031541 A1 | 3/2009 |
| WO | 2017080855 A1 | 5/2017 |

OTHER PUBLICATIONS

Abhishek Kasturi, Veljko Milanovic, and James Yang in "MEMS Mirror Based Dynamic Solid State Lighting Module", Society for Information Display 2016 International Symposium, May 24, 2016, San Francisco, CA.

(Continued)

*Primary Examiner* — Nicholas R. Pasko
(74) *Attorney, Agent, or Firm* — JDI PATENT; Joshua D. Isenberg; Robert Pullman

(57) ABSTRACT

A MEMS micromirror device comprising, a reflective movable mirror, and a surrounding substrate coplanar to the mirror. A physical gap between the mirror and the surrounding substrate filled with fluid and finger structures extend from a perimeter of the movable mirror into the physical gap.

6 Claims, 15 Drawing Sheets

(56) References Cited

U.S. PATENT DOCUMENTS

| | | |
|---|---|---|
| 6,667,837 B1 | 12/2003 | Shockey |
| 6,717,715 B2 | 4/2004 | Holl et al. |
| 6,744,173 B2 * | 6/2004 | Behin .................. B81C 1/0015 |
| | | 359/224.1 |
| 6,787,969 B2 * | 9/2004 | Grade ................... H02N 1/008 |
| | | 359/223.1 |
| 6,972,882 B2 | 12/2005 | Ring et al. |
| 6,988,338 B1 | 1/2006 | Chen et al. |
| 6,999,228 B2 | 2/2006 | Faase et al. |
| 7,116,456 B2 | 10/2006 | Hwang et al. |
| 7,295,726 B1 | 11/2007 | Milanovic et al. |
| 7,428,353 B1 | 9/2008 | Milanovic et al. |
| 7,456,497 B2 | 11/2008 | Higashi |
| 7,483,211 B2 | 1/2009 | Nakamura et al. |
| 7,538,471 B2 | 5/2009 | Kurozuka et al. |
| 7,848,002 B2 | 12/2010 | Ichikawa et al. |
| 7,898,724 B2 | 3/2011 | Liu et al. |
| 7,901,969 B2 | 3/2011 | Ichikawa et al. |
| 7,924,441 B1 | 4/2011 | Milanović |
| 7,933,059 B2 | 4/2011 | Nishino et al. |
| 8,043,513 B2 | 10/2011 | Milanovic et al. |
| 8,138,588 B2 | 3/2012 | Haskett |
| 8,174,746 B2 | 5/2012 | Miyagawa et al. |
| 8,194,305 B2 | 6/2012 | Maeda et al. |
| 8,254,006 B2 | 8/2012 | Miyagawa et al. |
| 8,368,196 B2 | 2/2013 | Akashi et al. |
| 8,427,657 B2 | 4/2013 | Milanović |
| 8,729,770 B1 | 5/2014 | Milanovic |
| 8,767,176 B2 | 7/2014 | Bleidistel et al. |
| 9,063,325 B2 | 6/2015 | Sano et al. |
| 9,222,955 B2 | 12/2015 | Hoefer et al. |
| 10,338,377 B1 | 7/2019 | Milanovićet al. |
| 2003/0142383 A1 | 7/2003 | Nanjyo et al. |
| 2003/0218283 A1 * | 11/2003 | Yasumura .......... G02B 26/0841 |
| | | 267/136 |
| 2007/0242920 A1 | 10/2007 | Lin et al. |
| 2008/0273234 A1 | 11/2008 | Mehrl et al. |
| 2008/0285120 A1 | 11/2008 | Lo et al. |
| 2011/0205551 A1 | 8/2011 | Saito et al. |
| 2012/0257280 A1 | 10/2012 | Sano et al. |
| 2014/0168775 A1 | 6/2014 | Arakawa |
| 2014/0176931 A1 | 6/2014 | Phillips et al. |
| 2014/0333912 A1 | 11/2014 | Bleidistel et al. |
| 2016/0131893 A1 * | 5/2016 | Kim ....................... H02N 1/002 |
| | | 359/200.6 |
| 2016/0342095 A1 | 11/2016 | Bieling et al. |
| 2018/0045990 A1 | 2/2018 | Wada et al. |
| 2018/0164541 A1 | 6/2018 | Chang et al. |

OTHER PUBLICATIONS

Final Office Action for U.S. Appl. No. 15/882,859, dated Dec. 9, 2020.

Final Office Action for U.S. Appl. No. 15/882,859, dated Mar. 13, 2020.

Non-Final Office Action for U.S. Appl. No. 15/882,859, dated Jul. 20, 2020.

Non-Final Office Action for U.S. Appl. No. 15/882,859, dated Nov. 13, 2019.

Notice of Allowance for U.S. Appl. No. 15/882,859, dated Apr. 21, 2021.

U.S. Appl. No. 15/882,859, filed Jan. 29, 2017.

U.S. Appl. No. 17/410,766, filed Aug. 24, 2021.

U.S. Appl. No. 62/451,943, filed Jan. 30, 2017.

Veljko Milanović, Abhishek Kasturi, James Yang, "Novel Fluidic Packaging of Gimbal-less MEMS Mirrors for Increased Optical Resolution and Overall Performance", SPIE Defense and Commercial Sensing Conference 2016, Apr. 20, 2016, Baltimore, MD.

Veljko Milanović, Abhishek Kasturi, James Yang, Frank Hu in A Fast Single-Pixel Laser Imager for VR/AR Headset Tracking.

Veljko Milanović, Abhishek Kasturi, James Yang, Yu Roger Su, Frank Hu in Novel Packaging Approaches for Increased Robustness and Overall Performance of Gimbal-less MEMS Mirrors.

English Machine translation of WO-2009031541-Aq (Year:2009).

Non-Final Office Action for U.S. Appl. No. 17/551,629, dated Feb. 14, 2024.

Non-Final Office Action for U.S. Appl. No. 17/551,682, dated Jan. 16, 2024.

Final Office Action for U.S. Appl. No. 17/410,766, dated Jun. 4, 2024.

Final Office Action for U.S. Appl. No. 17/551,629, dated Jun. 5, 2024.

Kaiser, et al., "Silicon Nitride Biaxial Pointing Mirrors with Stiffening Ribs." MOEMS and Miniaturized Systems II, M. Edward Motamedi, Rolf Goring, Editors 276 Proceeding of SPIE vol. 4561 (2001) 0277-786X/01. (Year: 2001).

Lutzenberger, B. Jefferey. "Analysis and Design of MEMS Scan Mirrors Using Periodically Stiffened Silicon Nitride." Montana State University, Apr. 2006. (Year: 2006).

Non-Final/Final Office Action for U.S. Appl. No. 17/410,766, dated Sep. 29, 2024.

* cited by examiner

Cross-section

Freq. responses – Q is very high although in 1 atm air

MEMS ACTUATORS HAVING A PHYSICAL GAP FILLED WITH FLUID

CLAIM OF PRIORITY

This application is a continuation from U.S. patent application Ser. No. 17/410,766 filed Aug. 24, 2021. U.S. patent application Ser. No. 17/410,766 is a divisional application of U.S. patent application Ser. No. 15/882,859 (issued on Sep. 7, 2021 as U.S. Pat. No. 11,111,133) filed Jan. 29, 2018. U.S. patent application Ser. No. 15/882,859 claims the priority benefit of provisional patent application No. 62/451,943, filed Jan. 30, 2017, the entire disclosures of which are incorporated herein by reference.

CROSS-REFERENCE TO RELATED APPLICATION

This application is related to U.S. patent application Ser. No. 11/938,197, filed Nov. 9, 2007 (now U.S. Pat. No. 8,043,513), the entire contents of which are incorporated herein by reference. This application is also related to U.S. patent application Ser. No. 11/003,271 filed Dec. 2, 2004 (now U.S. Pat. No. 7,295,726), the entire disclosures of which are incorporated herein by reference.

FIELD OF THE INVENTION

Embodiments of the present disclosure relate to micro-electro-mechanical-system (MEMS) one-dimensional (tilt) rotation actuators, one-dimensional (piston) vertical actuators, two-dimensional rotation (tip-tilt) actuators, and three dimensional (tip-tilt-piston) actuators and methods of improving the dynamic mechanical performance and thermal performance of these devices.

BACKGROUND OF THE INVENTION

A Micro-Electro-Mechanical-System (MEMS) device is a micro-sized electro-mechanical structure having fabricated by various microfabrication processes mostly derived from integrated circuit fabrication methods. Such a system may also include electronic circuits fabricated together with such a structure to perform a complete function, usually that of a sensor or an actuator. The developments in the field of MEMS allow for the bulk production of microelectromechanical scanning mirrors and scanning mirror arrays that can be used in all-optical cross connect switches, 1×N, N×N optical switches, variable optical attenuators, laser displays, bio-medical imaging, etc.

It has been observed that MEMS scanning mirror and mirror arrays, when illuminated with high intensity light can suffer damage and performance degradation. Due to the combined effect of the absorption of a portion of the incident illumination and the thermal isolation of the MEMS mirrors, the temperature of the mirror can increase significantly. This increase in temperature can cause damage to the reflective surface, reducing the reflectivity of the mirror and further increasing the temperature, resulting in a thermal runaway condition. Additionally, the increase in temperature of the MEMS mirror or mirror arrays can cause physical deformation of the reflective surface, degrading the performance of the device by distorting the shape of the reflected beam.

Improving only reflectance could result in unacceptable reduction of fundamental performance parameters of the mirror. Thick and high-stress high-reflectance coatings would result in slower and less optical flat mirrors etc. The problem being solved here is to maintain ALL of the highest functionality parameters and to additionally improve optical power tolerance and shock/vibe tolerance.

It has also been observed that the light weight MEMS mirrors and mirror arrays, with the accompanying slender mechanical drive structures and actuators, allow the devices to operate at high speeds and be highly responsive. These devices' structures typically exhibit high quality factors with little natural damping when excited near natural resonant frequencies. This high quality factor can be desirable, allowing the device to be driven at low power in resonant mode at or near its natural frequencies, however, this high quality factor makes the system sensitive to damage when driven near these frequencies, or when subject to external forces near these frequencies during handling, shipment, etc.

It is within this context that aspects of the present disclosure arise.

DETAILED DESCRIPTION OF THE PREFERRED EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "upper", "lower", etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to embodiment(s) of the present invention. While the invention will be described in conjunction with the embodiment(s), it will be understood that they are not intended to limit the invention to these embodiments or to the quantities and arrangements of elements within the embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, and components have not been described in detail as not to unnecessarily obscure aspects of the present invention.

Figure 1A:
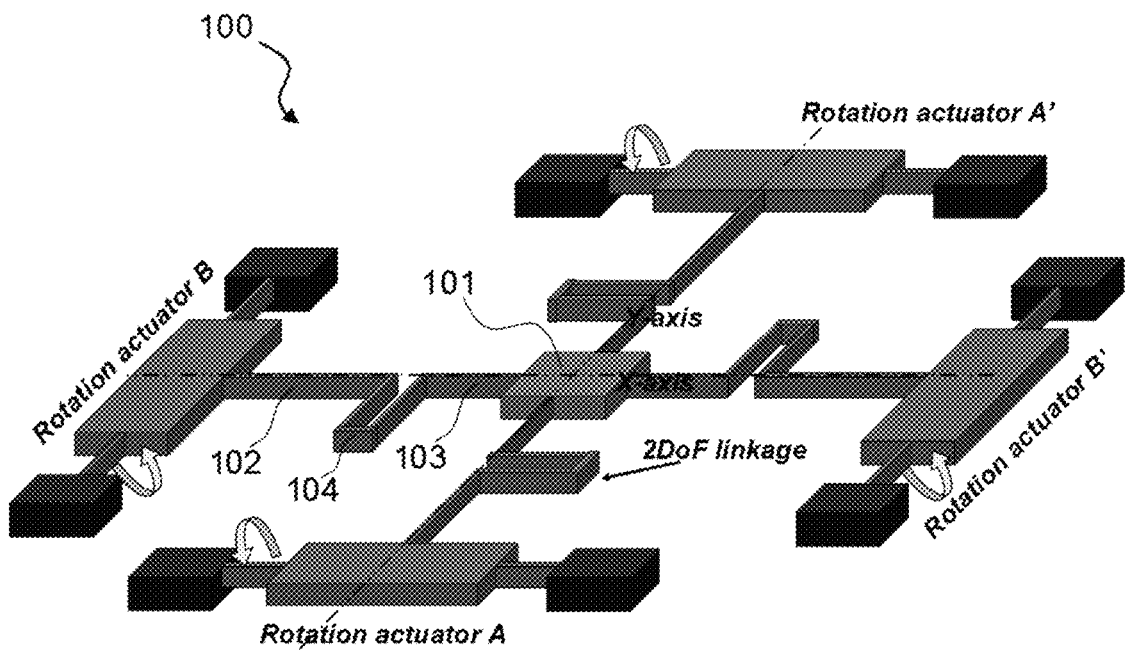
FIG. 1A is a schematic diagram of a gimbal-less two axis MEMS mirror device using four rotators which surround the MEMS mirror on four sides, to scan in two axes.

FIG. 1A is a schematic diagram of a two axis gimbal-less MEMS mirror device 100 using four rotators which surround the MEMS mirror on four sides, to scan in two axes. This class of MEMS micromirror is shown as reference to allow for effective presentation of the preferred embodiments of the invention, however, the present invention is applicable to a wide variety of MEMS micromirror systems and configurations. MEMS device 100 is designed to allow precise movement and positioning of a mirror plate 101 with respect to two axes. Key to the operation of the MEMS device 100 is the use of an outer linkage 102 and an inner linkage 103, separated with a rotational transformer 104.

Figure 1B:
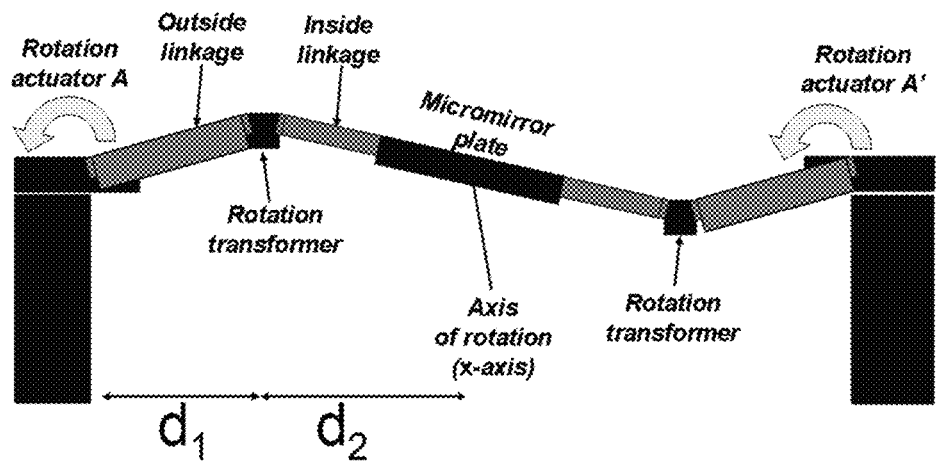
FIG. 1B is a cross sectional view of a two axis gimbal-less MEMS mirror device.

FIG. 1B illustrates the operation of the MEMS device 100 which results in the controlled rotation of the mirror plate 101 about two axes by examining a single axis in cross section. Activation of the rotational actuator A and A' in tandem results in each respective outside linkage 101 to raise out of plane. The rotational transformers 104 allow the inner linkages 103 and mirror plate 101 to rotate while maintaining the mirror's center of gravity in the plane of the opposing actuator assembly. This design, particularly the use of rotational transformers 104 allow the two axis rotational actuator systems to operate largely independently, giving the MEMS device 100 controlled two axis motion.

Figure 2A:
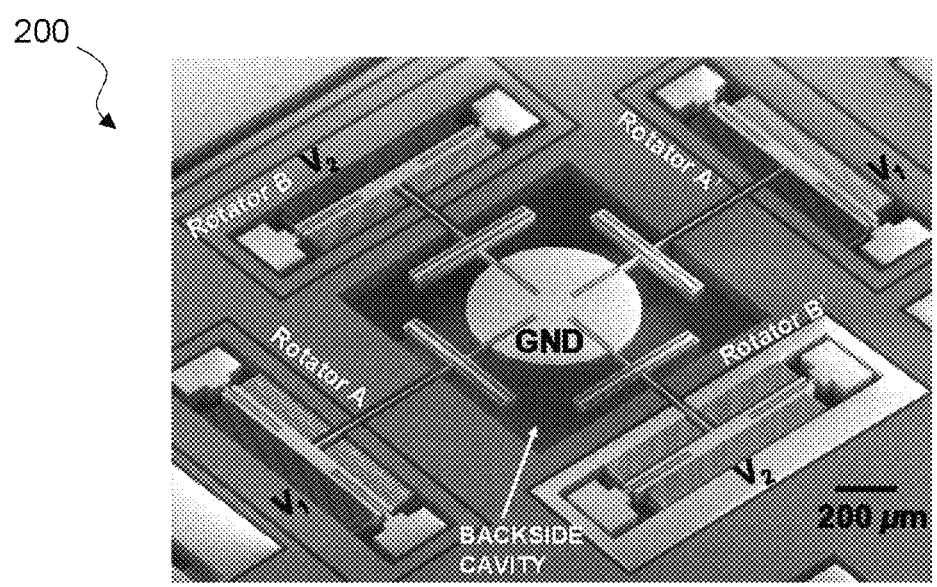
FIG. 2A is an SEM micrograph of a two axis gimbal-less MEMS mirror device using four rotators which surround the MEMS mirror on four sides, to scan in two axes.

FIG. 2A is an SEM micrograph of a two axis gimbal-less MEMS mirror device using four rotators which surround the micromirror on four sides, to scan in two axes. The images shows the device realized in a silicon micromachined process, with the mirror and each independent axis drive structures visible.

Figure 2B:
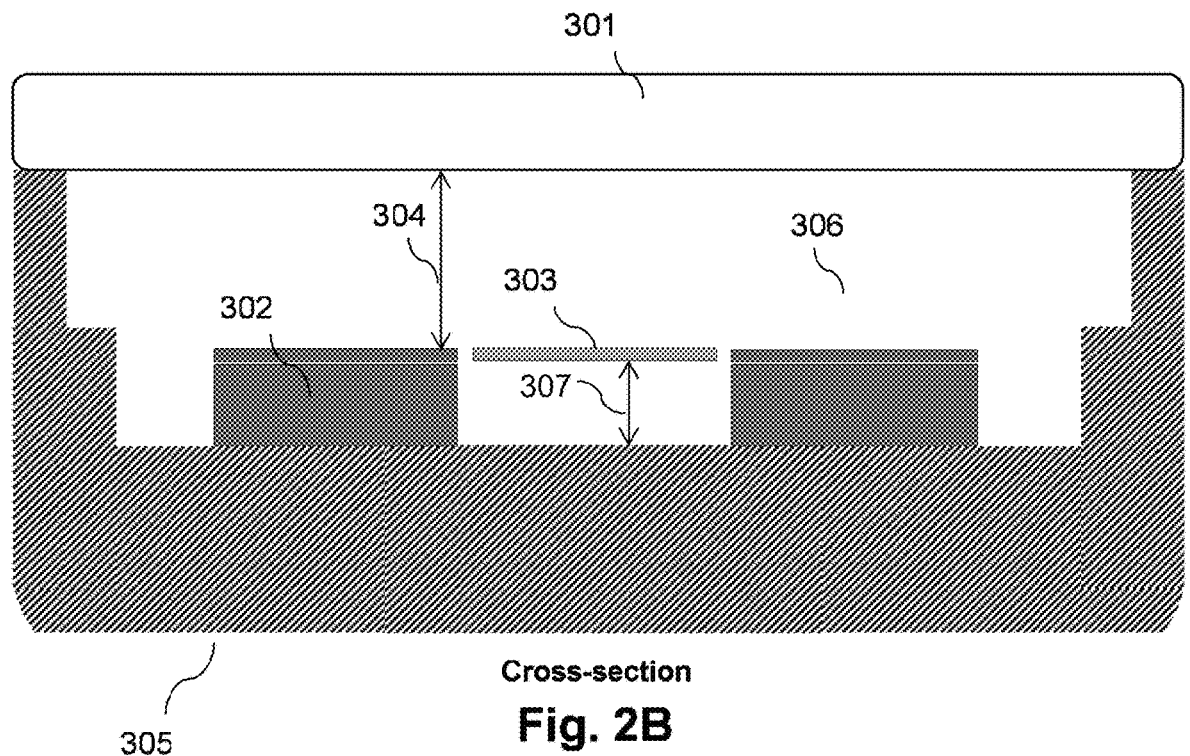
FIG. 2B is cross section diagram of a packaged MEMS mirror device.

FIG. 2B is cross section diagram of a packaged micromirror device, shown in a typical package configuration. An electronic package 305 is shown with an attached window 301, which together create a protective environment for the reliable operation of the enclosed MEMS device. The electronic package 305 may be composed of ceramic material with integrated metal electrical leads that serve to provide a pathway for electrical signals to be brought in an out of the electronic package. In some implementations the electronic package may be composed of plastic, thermoplastic material, or similar organic material such as FR4, with integrated electrical leads providing a pathway for electrical signals. The window provides optical access for incoming and reflected beams of light, and as such is composed of material highly transparent to the wavelength of light being utilized in the system. For optical wavelengths of light the window 301 may be composed of glass, quartz, or optically transparent plastic. The MEMS micromirror device 302 is shown with the key component, the mirror 303. Several gaps are highlighted which are most relevant to the present invention. The distance between the top surface of the device 301 and the MEMS device 302 outside the perimeter of the mirror 303 is the upper gap 304. The distance below the mirror 303 and the surface of the electronic package 305 is the lower gap 307. An atmosphere is enclosed within a cavity 306 in the electronic package 305 between the mirror 303 and window 301. In certain implementations the cavity 306 may contain a fluid exhibiting a thermal conductivity higher than that of air (0.03 W/mK) or higher than that of Helium (0.152 W/mK).

Figure 3:
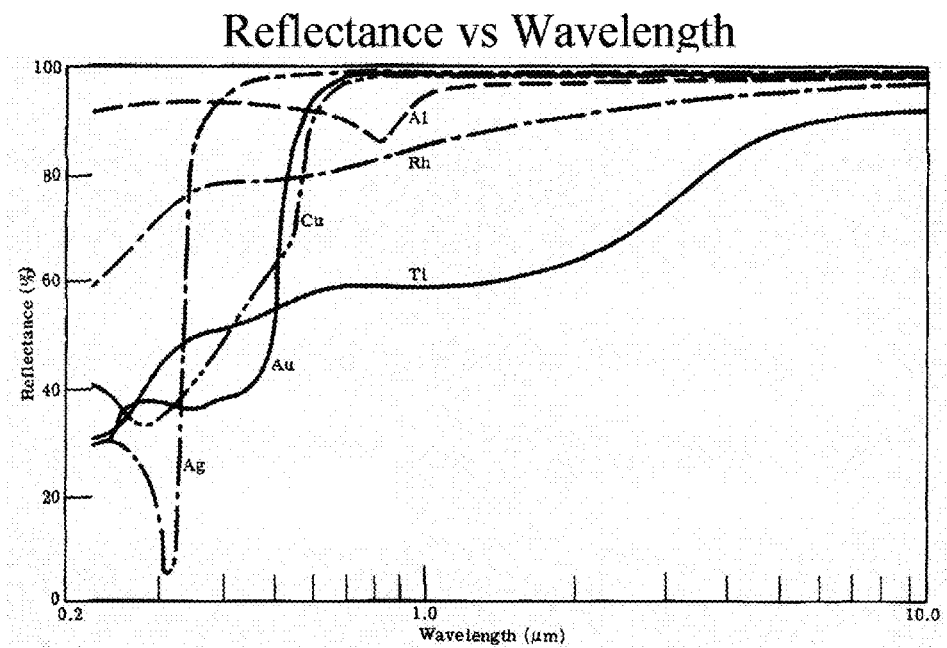
FIG. 3 is a graph demonstrating the relationship between light wavelength and reflectance of three elemental materials.

FIG. 3 is a graph demonstrating the relationship between the wavelength of incident light and reflectance of three elemental materials. The primary function of MEMS micromirror devices is to efficiently reflect incident beams in a specific direction in a controlled manner. As such, the higher the reflectivity of the surface the higher percentage of the incident light will be reflected. The mirror surface may be coated with reflective metals or with dielectric multi-layer coatings to increase this reflectivity. FIG. 3 shows how, while the reflectivity for aluminum, silver, and gold may be quite high for some wavelengths, it is never quite perfect, and at some wavelengths can be rather poorly reflecting. The fraction of incident light that is not reflected by the mirror is thermalized in the mirror surface, heating the mirror, and flows as heat into the mirror and surrounding materials. The present invention teaches approaches to minimize the temperature rise of the mirror surface and the associated damage and performance degradation caused by that temperature rise.

Figure 4:
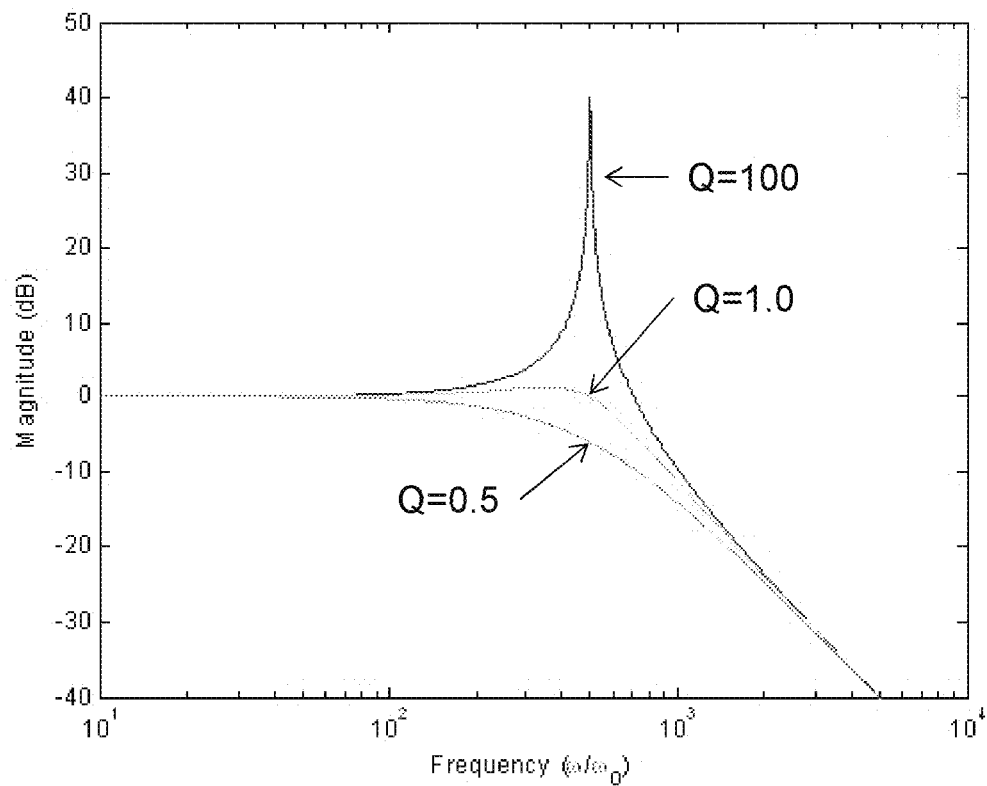
FIG. 4 is a graph demonstrating the relationship between drive frequency of a MEMS mirror device and the mechanical response of the device for different quality factors.

FIG. 4 is a graph demonstrating the relationship between drive frequency of a micromirror device and the mechanical response of the device for different quality factors. Three response curves are shown for three levels of quality factor, Q=100, 1, and 0.5. MEMS micromirror device's structure typically exhibit a high quality factor with little natural damping when excited near its natural frequencies. This high quality factor can be desirable, allowing the device to be driven at low power in resonant mode at or near its natural frequencies, however, this high quality factor makes the system sensitive to damage when driven near these frequencies, or when subject to external forces near these frequencies during handling, shipment, etc. The curve showing Q=1 has minimal amplification of motion when excited near the structure's natural frequency. The curve showing Q=0.5 is known as a critically damped system, a case where there is essentially no amplification of motion due to excitation near the system's natural frequency. The present disclosure teaches approaches to design or tailor the quality factor to a low or moderate quality factor, thereby minimizing the potential for damage due to mechanical excitations near the system's natural frequency.

Figure 5A:
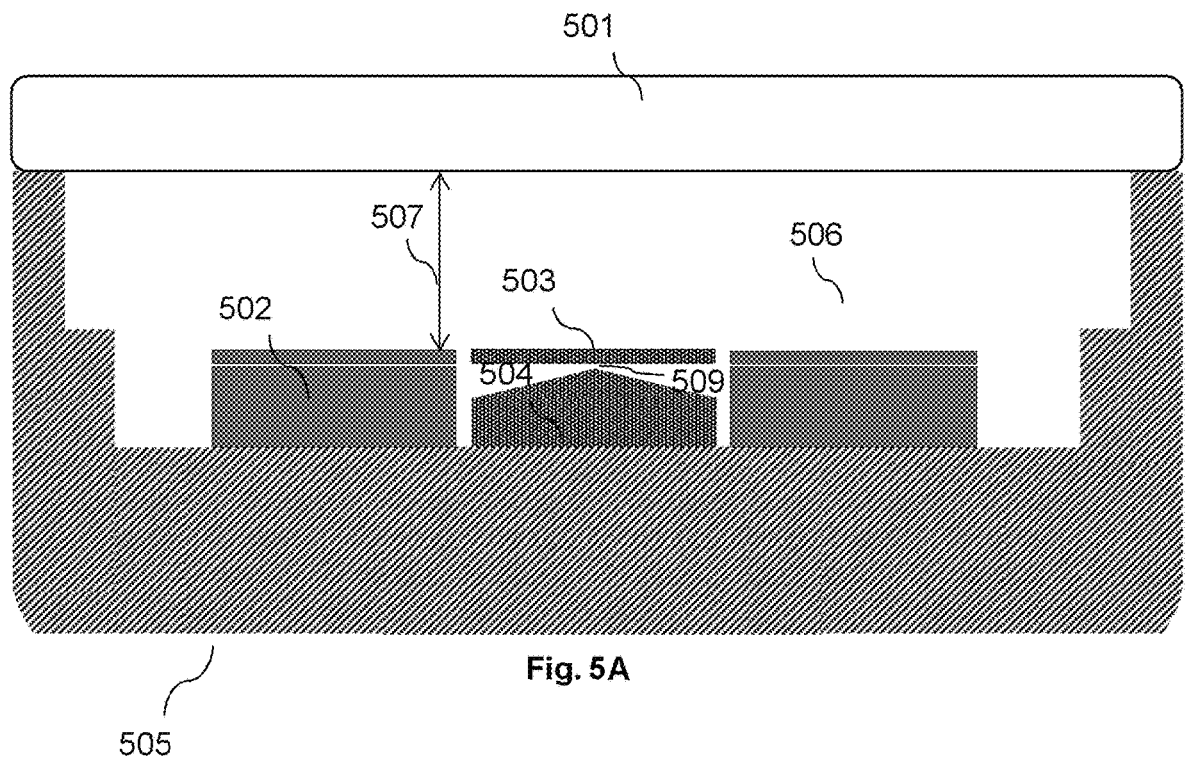
FIG. 5A is a cross section diagram of a packaged MEMS device with a cooling structure situated underneath the mirror according to an aspect of the present disclosure.

FIG. 5A shows a cross section diagram of a packaged MEMS device 502 with a conical or pyramidal cooling structure 504 situated underneath the mirror 503 according to an aspect of the present disclosure. The cooling structure 504 partially fills part of a cavity 506 that would otherwise be filled with an atmosphere, leaving a sufficient mirror clearance gap 509 that allows the mirror 503 to rotate unimpeded when activated by the device's actuators. The cooling structure 504 serves to reduce the temperature rise of the mirror due to absorbed incident light by replacing some of the typically low thermal conductivity atmosphere 506 with a solid, higher thermal conducting material. As such, the thermal resistance, or resistance to heat flow between the heated mirror surface 503 and the relatively constant temperature thermal sink created by the electronic package 505 is reduced. The atmosphere in the cavity 506 utilized in packaged MEMS micromirrors may be atmospheric air, dry nitrogen, or argon which have thermal conductivities on the order of 0.026, 0.026, and 0.018 W/mK. A cooling structure 504 that is made from a material that is higher thermal conductivity than the atmosphere in the cavity 506 that it replaces reduces the thermal resistance of the system, thereby reducing the risk of thermal damage from absorption of incident light. By way of example and not by way of limitation, in some implementations the cooling structure 504 is made of copper. In alternative implementations the cooling structure 504 may be made of aluminum, steel, iron, nickel, plastics, or ceramic. In FIG. 5A an upper gap 507 is shown between the mirror 503 and a window 501 without modification with respect to the current state of the art.

The cooling structure 504 provides a desirable reduction of the quality factor of the system by adding additional damping by replacing the previous open cavity of freely flowing atmosphere with a solid cooling structure 504 and a thin, constrained layer of atmosphere in the clearance gap 509. As the mirror 503 is driven and tilted down to the side by the actuators, a portion of the clearance gap 509 closes, expelling atmospheric fluid. The viscous drag due to the underside of the mirror 503 and the top of the cooling structure 504 dissipates energy in a much more effective manner than without a cooling structure 504, lowering the quality factor. Likewise, on the opposite side of the mirror 503 which is tilted up, the clearance gap 509 increases in volume, drawing in atmospheric gas. This fluid drawn in similarly experiences viscous drag against the solid surface, dissipating energy, and lowering the quality factor.

The cooling structure 504 in the device 502 enables a reduction in the temperature rise of the mirror 503 when illuminated by light and enabling a moderation of the system's quality factor, relating to the atmosphere in the cavity 506. The use of ambient air standard industrial/scientific gases such as argon and nitrogen are convenient when used as the atmosphere in the cavity 506 in electronic packaging of MEMS mirrors, but their low thermal conductivity and low viscosity are a major contributing factor to mirror temperature rise and associated damage, and excessive quality factor that leads to potential damage. By replacing these typical gases used for the atmosphere 506 with higher thermal conductivity, higher density and higher viscosity gases and liquids, a high level of performance can be maintained and the problems of excessive mirror temperature rise and excessively high quality factor are greatly mitigated. In some implementations the atmosphere in the cavity 506 may contain sulfur hexafluoride ($SF_6$) or argon (Ar) or neon (Ne) or nitrogen ($N_2$) or another gas or a combination of the gases. Alternatively, the cavity may be filled (or partly filled) with a dielectric liquid such as a silicone oil or alkane.

Figure 5B:
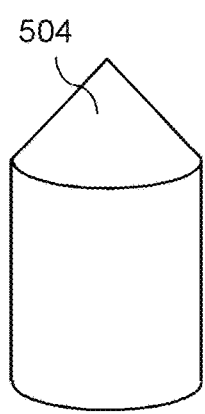
FIGS. 5B-5D are three different designs for a cooling structure to be situated underneath the mirror according to an aspect of the present disclosure.
Figure 5C:
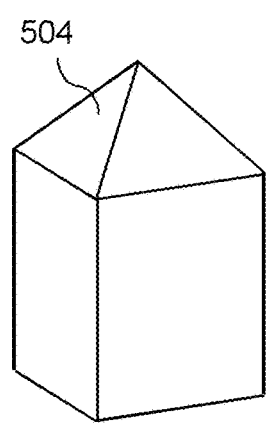
Figure 5D:
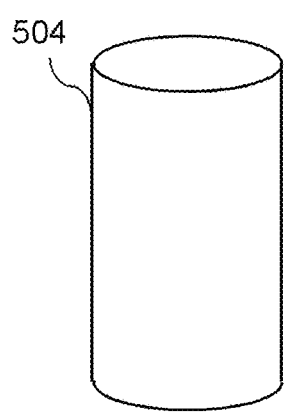

FIGS. 5B, 5C, and 5D illustrate some of the possible variations for the geometry of the cooling structure 504, shown with a cone, four sided pyramid, and a flat topped cylindrical form. FIG. 5B shows a conical form cooling structure that allows the cone surfaces to come as close as possible to the underside of the mirror 503, maximizing the desirable temperature and quality factor reductions while not compromising the function or free motion of the mirror.

Figure 6:
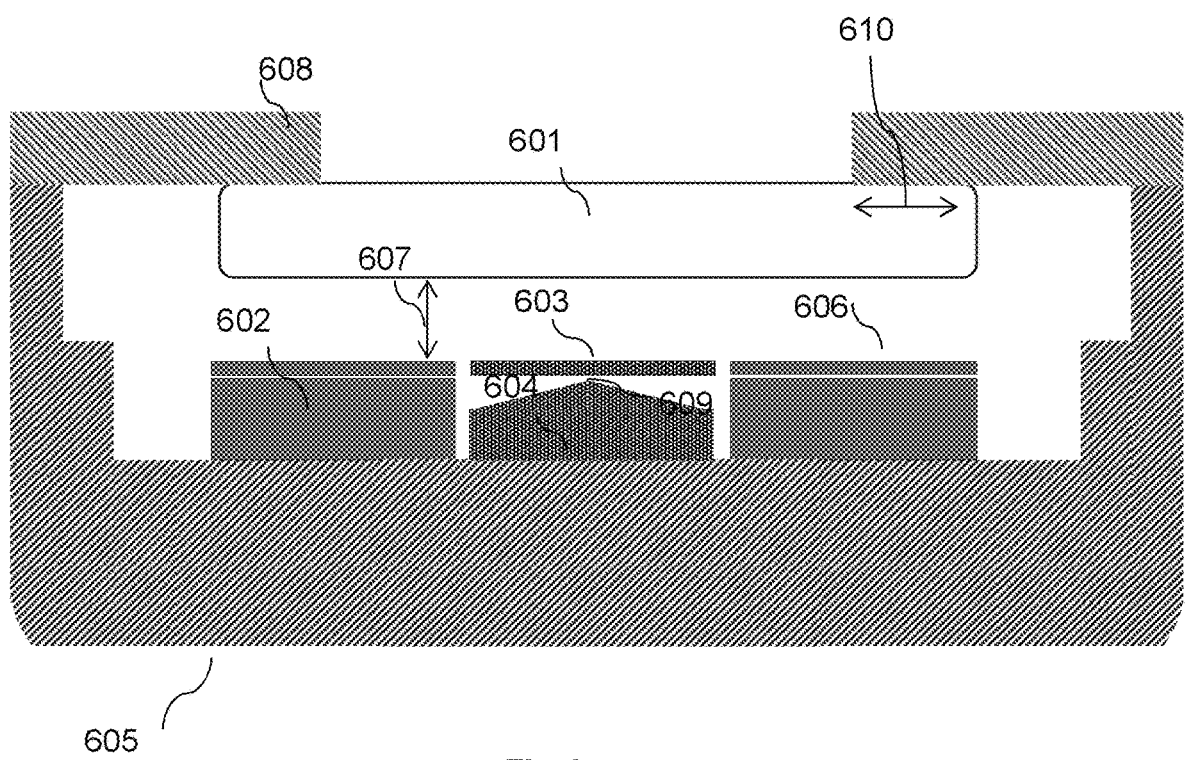
FIG. 6 is a cross section diagram of a packaged MEMS device with a lowered window along with the cooling structure according to an aspect of the present disclosure.

FIG. 6 shows a cross section diagram of a packaged MEMS device 602 with a lowered window 601 along with the cooling structure 604. As in FIG. 5A, the cooling structure 604 provides a useful reduction in mirror 603 temperature and useful reduction in quality factor by creating a dissipative thin clearance gap 609. In addition, the electronic package 605 is further modified to reduce the upper gap 607 by lowering the window 601. The window 601 may be lowered using lid 608 which reduces the upper gap 601, and draws undesirable heat through the lid-window bond area 610, as well as reduces the size of the window 601. In the preferred embodiment of the present invention the lid 608 is composed of copper. Additional embodiments include, but are not limited to materials with higher thermal conductivity than that window 601, such as aluminum, brass, nickel, plastic, or ceramic. The lid-window bond area 610 is designed to be wide enough to effectively draw heat from the window 601 but not be excessively large to obstruct bond wires used to electrically connect the device 602 to the electronic package 605. The reduced upper gap 607 lowers the temperature of the mirror 603 by reducing the thermal resistance across the atmosphere in a cavity 606 to the mirror. Additionally, it has been observed to also provide a desirable reduction in quality factor by increasing the viscous damping as the atmospheric fluid must move to accommodate changes in the upper gap 607 distance above the mirror 603 when it is in motion.

Figure 7:
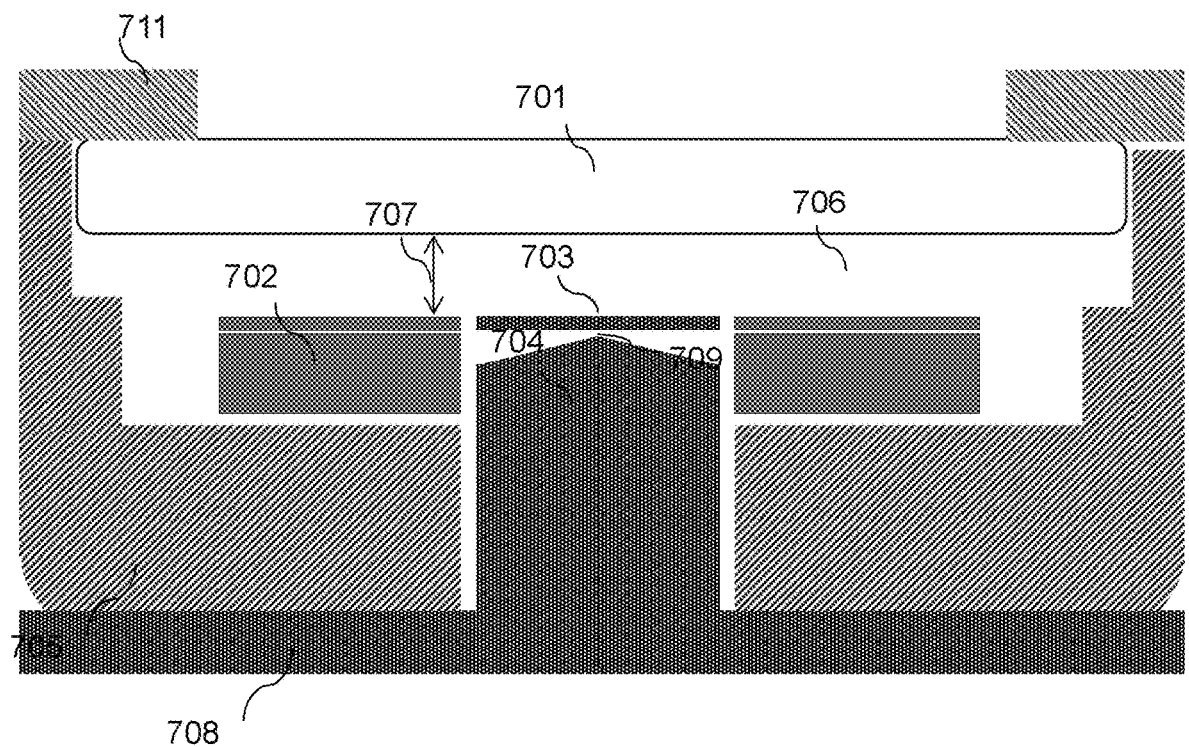
FIG. 7 is a cross section diagram of a packaged MEMS device with a heatsink extending out of the backside of the package to direct heat away to an external thermal ground.

FIG. 7 is a cross section diagram of a packaged MEMS device 702 with a heat sink 708 extending out of the backside of the package 705 to direct heat away to an external thermal ground. This configuration enhances the ability of the cooling structure 704 to draw heat across the clearance gap 703 by effectively moving the heat into a large area heat sink 708 that can be thermally connected to an external thermal ground. As with previous embodiments this feature may be combined with a mirror 701 lowered by means of a lid 711. In the preferred embodiment of the present invention the heat sink 708 is composed of copper. Additional embodiments include, but are not limited to other relatively high thermal conductivity materials such as aluminum, brass, nickel, plastic, or ceramic.

Figure 8A:
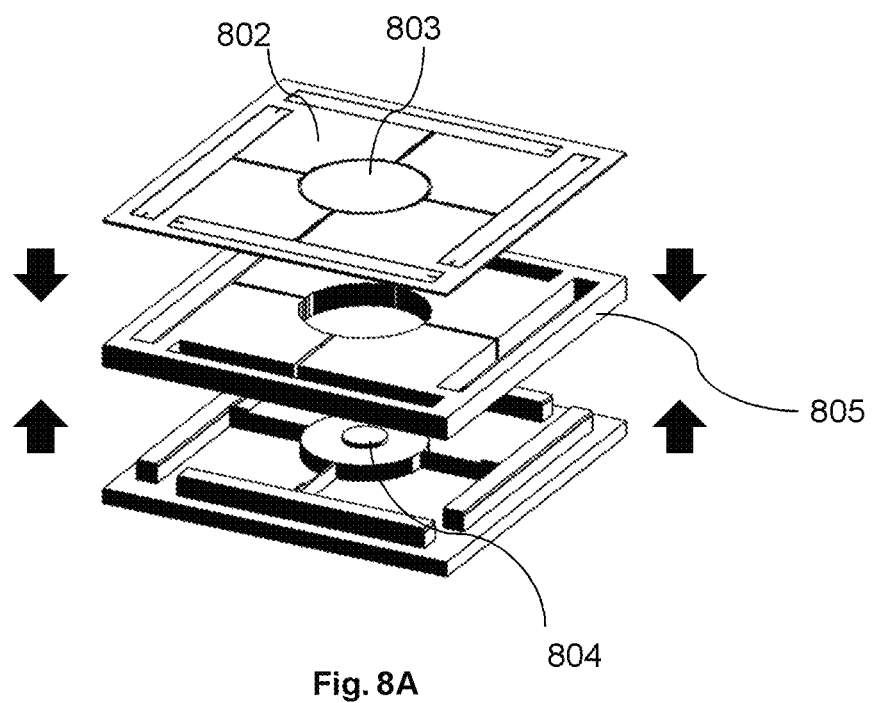
FIG. 8A is a schematic diagram of multi-component configuration to enable improved performance and cooling of a MEMS device according to an aspect of the present disclosure.

FIG. 8A is a schematic diagram of multi-component assembly configuration to enable improved performance and cooling. The reductions in mirror 803 temperature and quality factor may be realized in a manufacturing approach in which an upper device layer 802 is formed with a handle wafer 805. A cooling structure layer 804 may be separately fabricated and brought it in contact with the upper device layer 802 and handle wafer 805 to realize the improvements described herein.

Figure 8B:
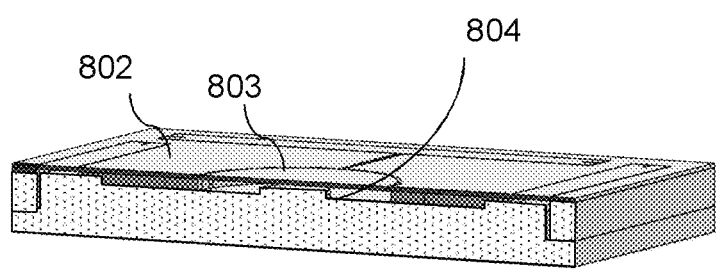
FIG. 8B is schematic diagram showing a monolithic configuration to enable improved performance and cooling of a MEMS device according to an aspect of the present disclosure.

FIG. 8B is schematic diagram showing a monolithic configuration to enable improved performance and cooling where the single device and handle wafer assembly 802, with mirror 803 are a single unit. The cooling structures 804 are formed from a top side etch of the handle wafer assembly 802. Such a monolithic configuration would differ from present manufacturing in that the handle wafer of the SOI wafer would include pre-etched front-side cavities prior to bonding with the device layer wafer and forming the SOI wafer. Instead of backside cavities which are presently etched later in the process from the backside of the SOI, the cavities would already be pre-etched and internal to the formed engineered SOI wafer. These pre-formed cavities can be of one level (depth) or multiple levels as shown in examples, such that different gaps to moving structures are provided.

The process of preparing the SOI wafer to form the structure would include etching backup cavities into the device layer wafer which will later allow forming of upper fingers in the combdrives. Also etching of one or multiple-depth GAP cavities in the handle wafer. Then the two wafers would be bonded face to face with an oxide layer to form the SOI wafer. After grind/polish or another method of reducing the device layer thickness to the desired thickness the final SOI wafer is formed which continues to standard combdrive processing.

Figure 9A:
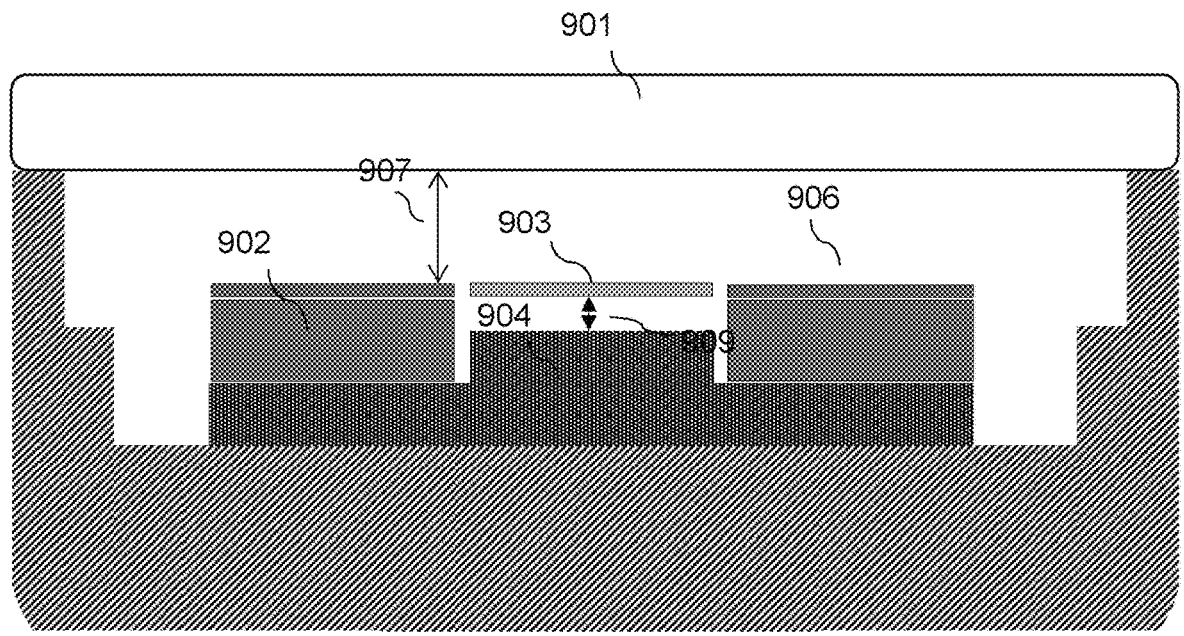
FIG. 9A is a cross section diagram of a cooling structure connecting the MEMS device to its package according to an aspect of the present disclosure.

FIG. 9A is a cross section diagram of a cylindrical cooling structure 904 connecting a MEMS device 902 to its package. The cooling structure 904 has an expanded base on which the MEMS device 902 is mounted. The cooling structure 904 is mounted to the electronic package 905. This embodiment provides the desirable reductions of temperature and quality factor of the present invention by creating a thin clearance gap 909, as well as providing reductions in the upper gap 907 due to the fact that is expanded base elevates the MEMS device 902 in the package closer to the window 901.

Figure 9B:
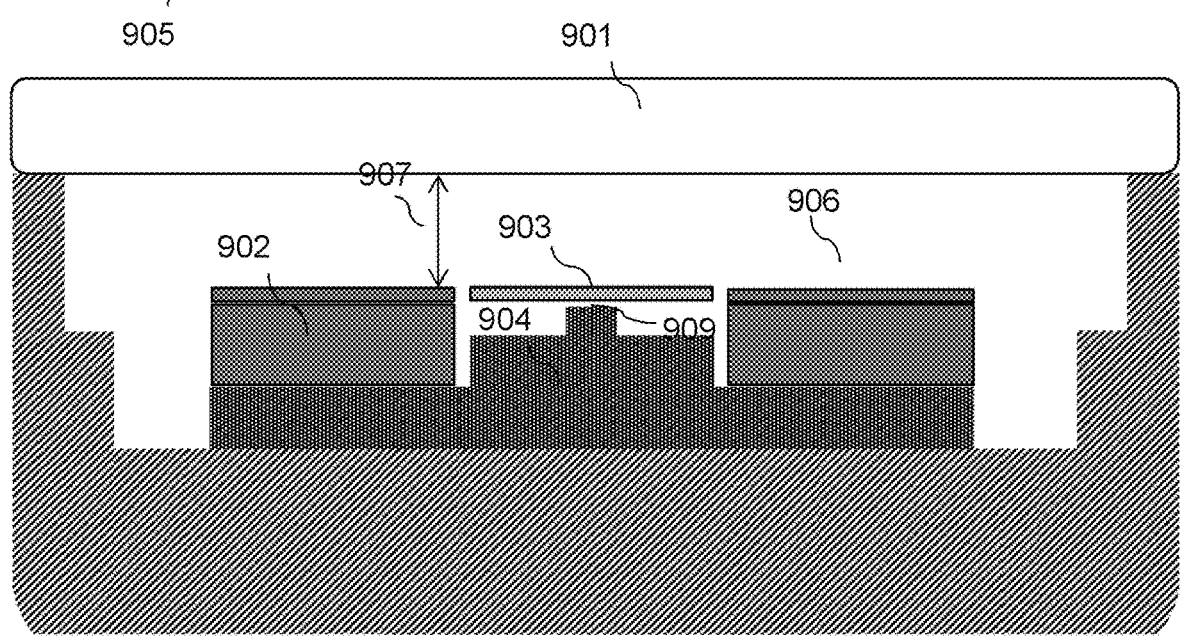
FIG. 9B is a cross section diagram of an alternative cooling structure connecting the MEMS device to its package with increased surface area contact and decreased fluid gap according to an aspect of the present disclosure.

FIG. 9B illustrates an alternative cooling structure 904 connecting the MEMS device 902 to its package 905. This configuration also has a cooling structure 904 with an expanded base, providing the beneficial reductions in surface temperature and quality factor. In this embodiment the cooling structure 904 is designed with a central elevated pedestal to provide additional thermal transfer and viscous drag by penetrating into the clearance gap 909, without impacting the free motion of the mirror 903.

As mentioned earlier the same configuration could be obtained as a monolithic wafer solution by pre-forming the handle wafer 902 as a wafer with appropriate cavities/gaps 909 to the moving structures. Therefore the SOI handle wafer would actually be the combination of 902 and 904 shown in FIG. 9.

Figure 10:
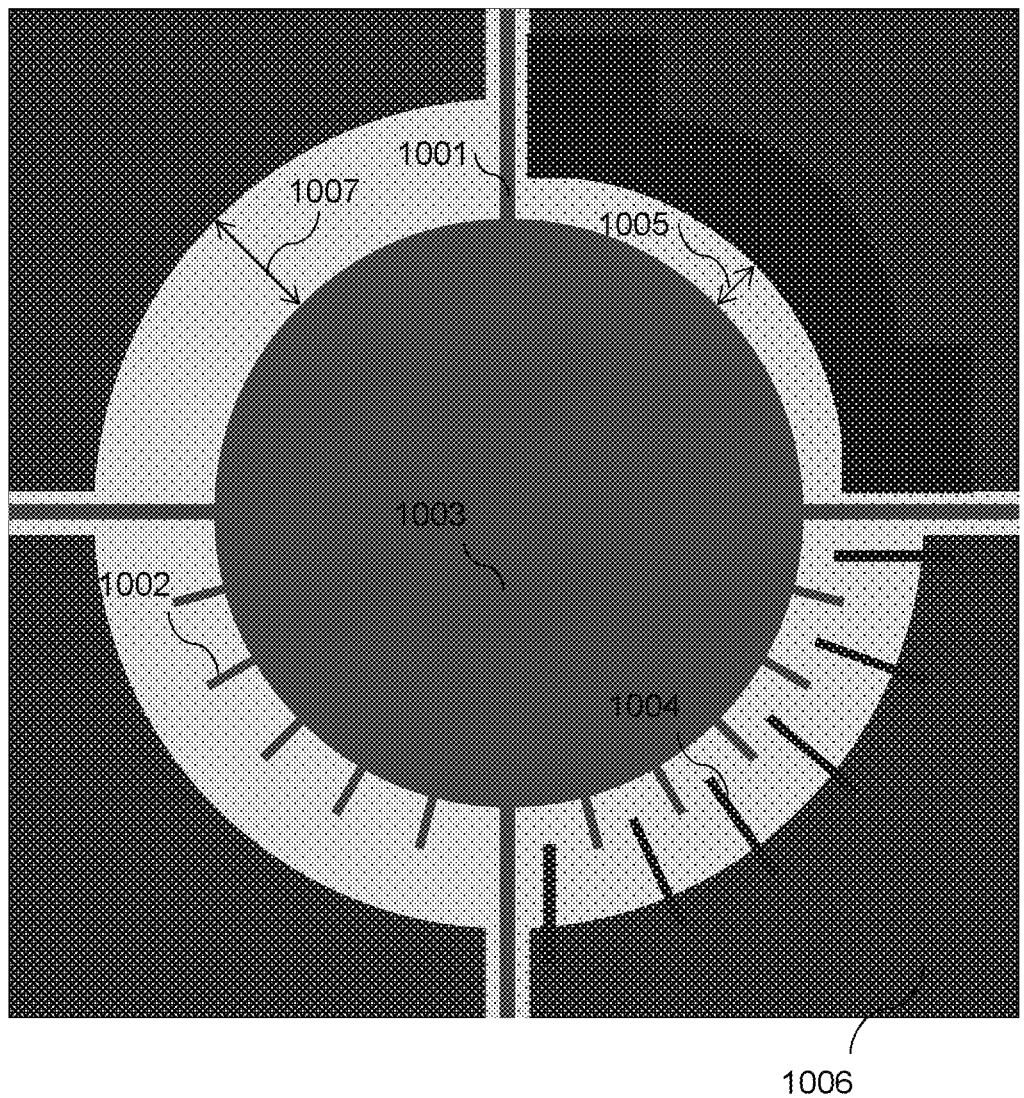
FIG. 10 is a schematic diagram of the MEMS mirror with four different configurations for increased thermal conductance according to aspects of the present disclosure.

FIG. 10 is a schematic diagram of the top view of a MEMS device layer 1006 showing four different configurations in each quadrant of the diagram, illustrating means of reducing undesirable temperature rise and quality factor of a mirror 1003. Regions of the static device layer 1006, the movable suspended structure, and the underlying cavity are shown. A standard design is shown in the upper left quadrant where the mirror-device layer gap 1007 is shown, designed with a significant distance such that the amount of heat flowing from the mirror 1003 to the device layer 1006 is low. Experimental and simulation work has shown that the long and slender nature of the suspended linkages 1001 similarly do not draw a significant amount of heat from the mirror 1003. In a standard design the majority of the heat flow is from the upper surface of the mirror 1003 to the upper atmosphere and from the lower surface of the mirror 1007 to the underlying surface. Methods to enhance these paths of heat transfer have been described previously hereinabove in separate embodiments.

In the upper right quadrant of FIG. 10 the mirror-device layer gap 1005 is significantly reduced, increasing the heat transfer across this gap from the mirror 1003 to the device layer 1006. This has the additional desirable effect of lowering the quality factor of the device in dynamic operation by increasing the viscous drag in the mirror-device layer gap 1005 as fluid must cycle in and out of the underlying cavity when the mirror 1003 is in motion.

In the lower left quadrant of FIG. 10 the mirror 1003 is enhanced with the addition of fingers 1002 which extend into the mirror-device layer gap 1007. These serve to reduce the temperature rise of the mirror 1003 when illuminated by incident light and reduce the quality factor of the dynamic system. This temperature reduction accomplished in this embodiment of the present invention by having the fingers 1002 extend and provide a thermal conduit for additional heat to flow across the gap to the device layer 1006, with minimizing the additional mirror mass that can affect the dynamics of the mirror. The quality factor of the device in dynamic operation is lowered by increasing the viscous drag in the mirror-device layer gap 1007 as fluid must cycle in and out of the underlying cavity and around the fingers 1002 when the mirror 1003 is in motion.

In the lower right quadrant of FIG. 10 the mirror 1003 and the outer device layer 1006 are enhanced with the addition of fingers 1004, which are interdigitated. These serve to reduce the temperature rise of the mirror 1003 when illuminated by incident light and reduce the quality factor of the dynamic system. This temperature reduction accomplished in this embodiment of the present invention by having the fingers 1004 extend and provide a thermal conduit for additional heat to flow across the gap to the device layer 1006, with minimizing the additional mirror mass that can affect the dynamics of the mirror. The quality factor of the device in dynamic operation is lowered by increasing the viscous drag in the mirror-device layer gap 1007 as fluid must cycle in and out of the underlying cavity and around the fingers 1004 when the mirror 1003 is in motion.

Figure 11:
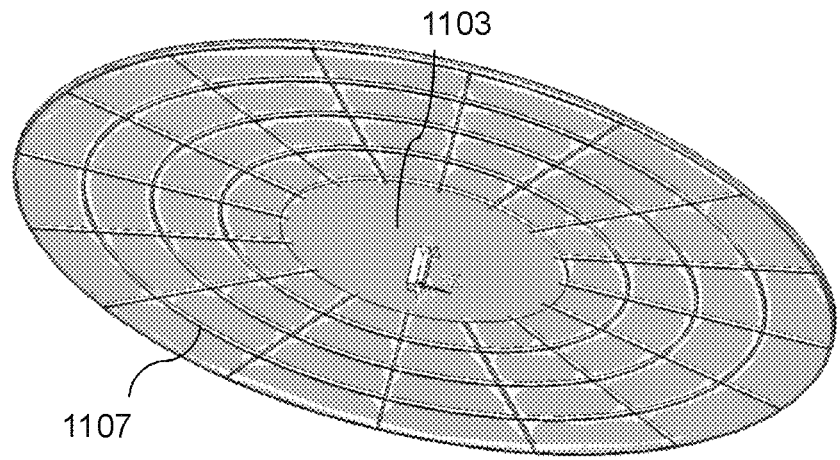
FIG. 11A is a schematic diagram of the underside of the MEMS mirror with radial structural fins for increased surface area contact with the surrounding fluid according to an aspect of the present disclosure.
FIG. 11B is a schematic diagram of the underside of the MEMS mirror with orthogonal structural fins for increased surface area contact with the surrounding fluid according to an aspect of the present disclosure.
Figure 11:
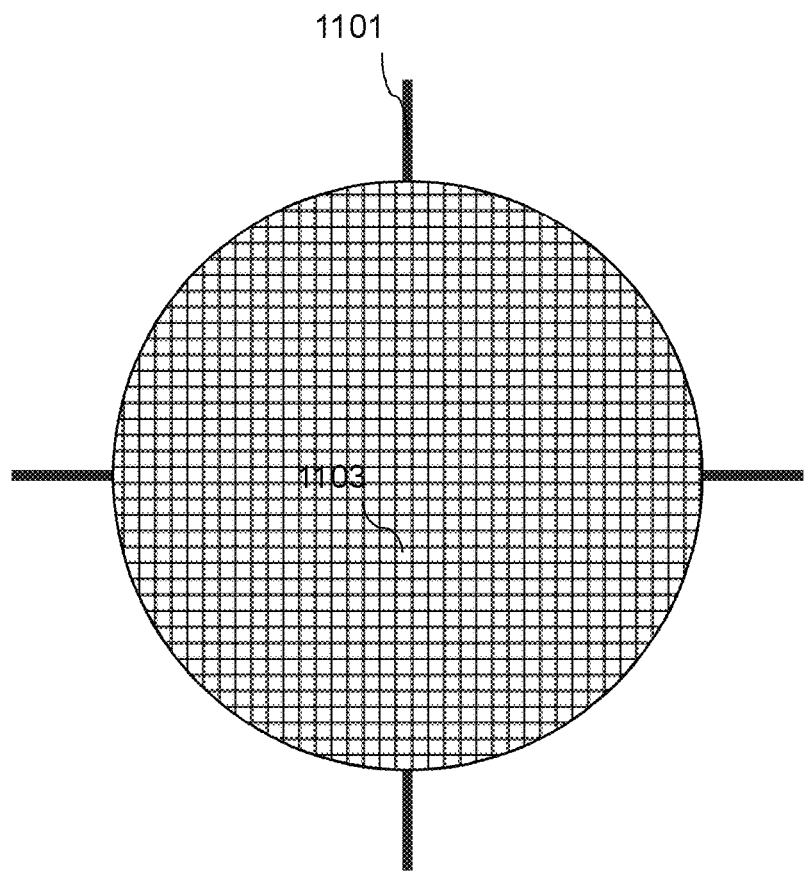

FIGS. 11A-11B illustrate the underside of a micromirror 1103 with structural fins 1107. The fins 1107 allow for the creating of a flat, strong mirror 1107 while minimizing the moment of inertia, but also provide additional benefits related to the mirror heating and quality factor issues. FIG. 11A shows the fins 1107 in a radial configuration. FIG. 11B shows the fins in an orthogonal configuration. The fins 1107 reduce the temperature rise of an illuminated mirror 1103 by increasing the surface area of the mirror 1103 with the atmosphere, enhancing the flow of heat. The fins 1107 also reduce the quality factor of the moving MEMS device by increasing the energy dissipated by viscous drag by disrupting the flow of fluid across the underside of the mirror 1103 as it is in motion.

Figure 12:
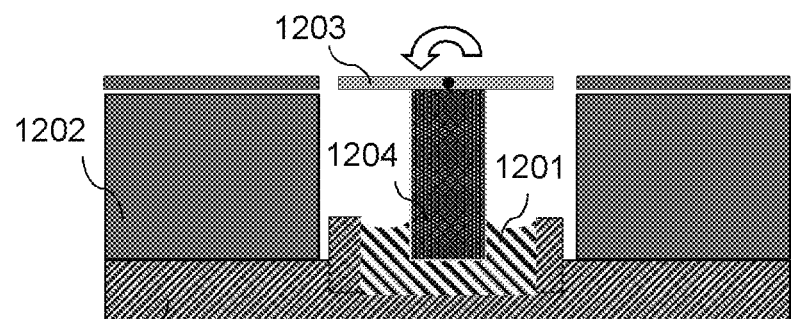
FIG. 12A-12C are cross-sectional schematic diagrams showing different configurations of a body extending from the backside of the mirror to the package in contact with a viscoelastic fluid according to aspects of the present disclosure.
Figure 12:
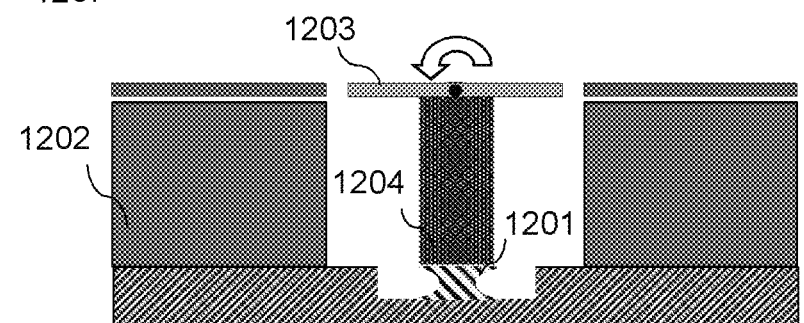
Figure 12:
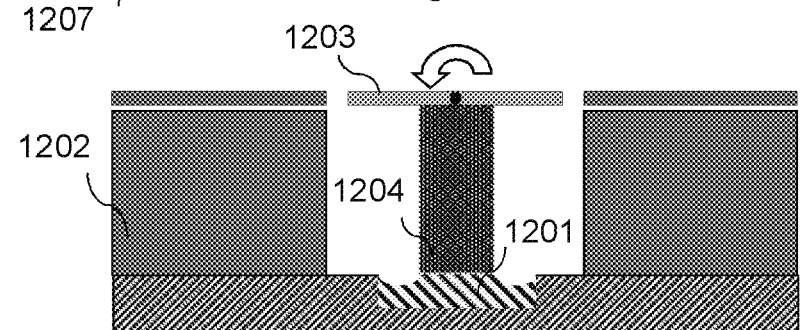

FIGS. 12A-12C are cross sectional views of different MEMS micro mirror device configurations. In these figures a viscous liquid or gel 1201 is in contact with a mirror extension 1204, as well as in contact with the underlying electronic package 1207. The mirror extension 1204 extends below the mirror 1203, extending a distance similar to the thickness of the device handle layer 1202. As the mirror is actuated and moves, the mirror extension 1204 rotates, creating relative motion between the mirror extension 1204 and the underlying electronic package 1207. This relative motion is retarded by the intervening viscous liquid or gel 1201. Energy is dissipated as the viscous liquid or gel 1201 is deformed and displaced, lowering the system's quality factor. Additionally, the thermal path created by the mirror extension 1204 and the viscous liquid or gel 1201 between the heated mirror 1203 and the underlying package 1207 reduces the temperature rise of the illuminated mirror 1203. FIG. 12A shows the viscous liquid or gel 1201 contained by a cavity in the package 1207 that extends into the cavity below the mirror 1203. FIG. 12B shows the viscous liquid or gel 1201 maintained in a small region just below the mirror extension 1204 in a recess in the package 1207. FIG. 12C shows the viscous liquid or gel 1201 contained below the mirror extension 1204 in a cavity in the package 1207. In the preferred embodiment of the present invention the viscous fluid or gel 1201 is Sylgard damping gel by Dow Corning. By way of example and not by way of limitation, the viscous fluid or gel 1201 may be silicone oil or a damping gel by Taica Corporation, or an adhesive with low stiffness by Norland or other manufacturers.

Figure 13:
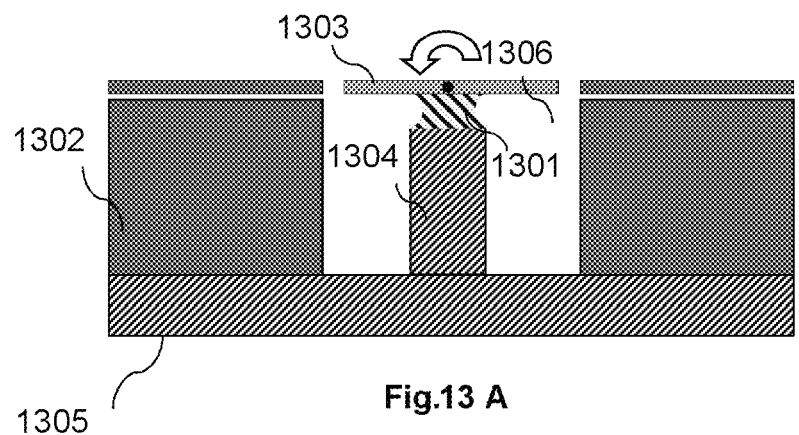
FIG. 13A-13B are cross-sectional schematic diagrams showing different configurations of a body extending from the package to the backside of the mirror in contact with a viscoelastic fluid according to aspects of the present disclosure.
Figure 13:
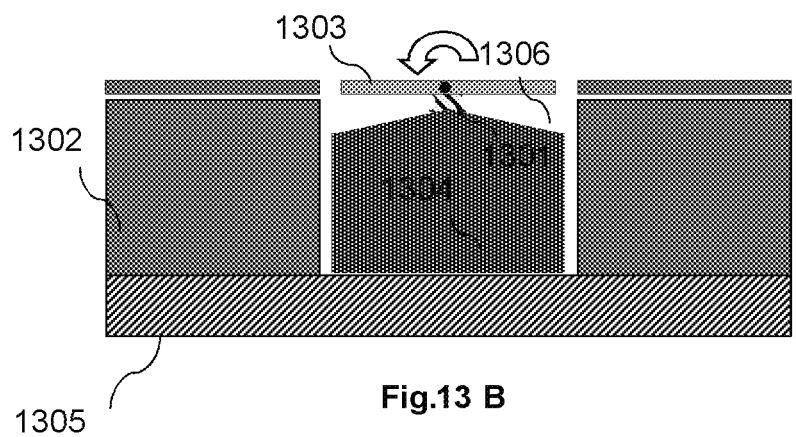

FIGS. 13A-13B show configurations of an underlying solid structure 1304 which is connected to the underside of a mirror 1303 by means of a region of viscous fluid or gel 1301. The underlying solid structure 1304 is designed such that it does not interfere with the motion of the mirror 1303. The quality factor of the moving mirror is reduced as energy is dissipated in the viscous fluid or gel 1301 by deformation as the mirror 1303 tilts. The undesirable increase in temperature of the mirror 1303 when illuminated is reduced by the creation of a thermal path from the mirror 1303, through the viscous fluid or gel 1301, through the underlying solid structure 1304, to the package 1305. FIG. 13A shows an embodiment of the present invention where the underlying structure 1304 is protrusion from and integral to the package 1305. FIG. 13B shows an embodiment where the underlying structure 1304 is a separate solid mounted to the package 1305. For example 1304 structure may be a separate device which is die attached to the package cavity 1305 prior to attaching the MEMS actuator around and above it.

Figure 14:
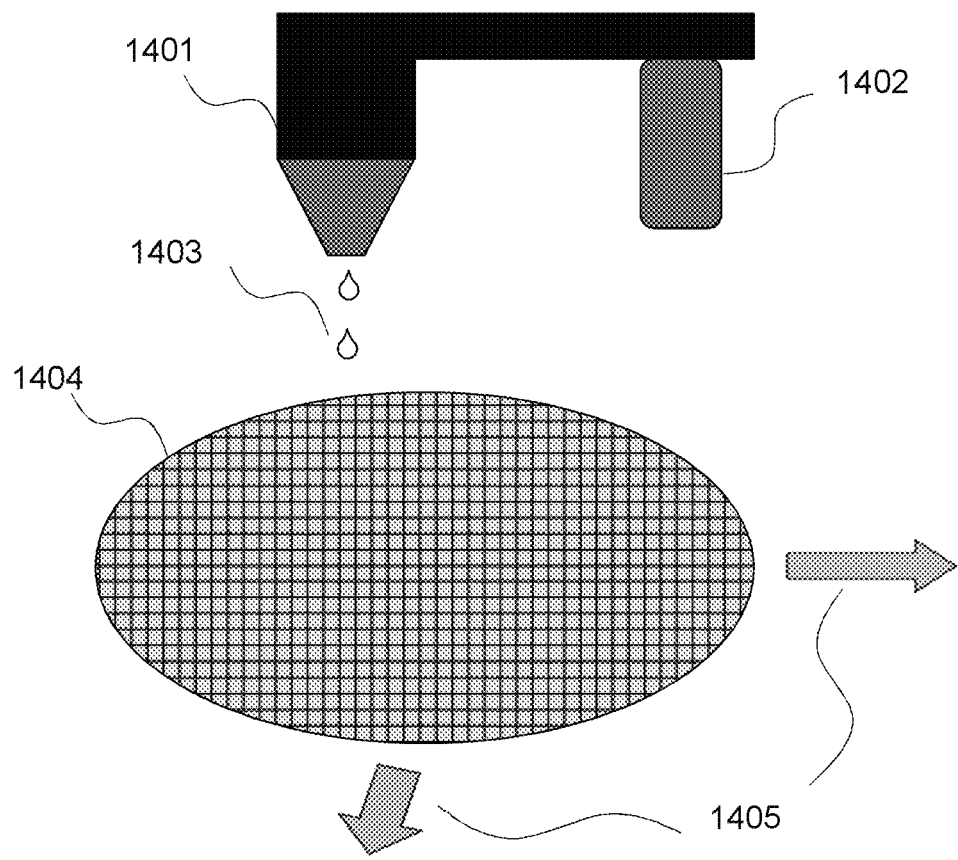
FIG. 14A-14B are schematic diagrams illustrating different techniques to inject viscoelastic fluids onto specific structures of the MEMS device according to aspects of the present disclosure.
Figure 14:
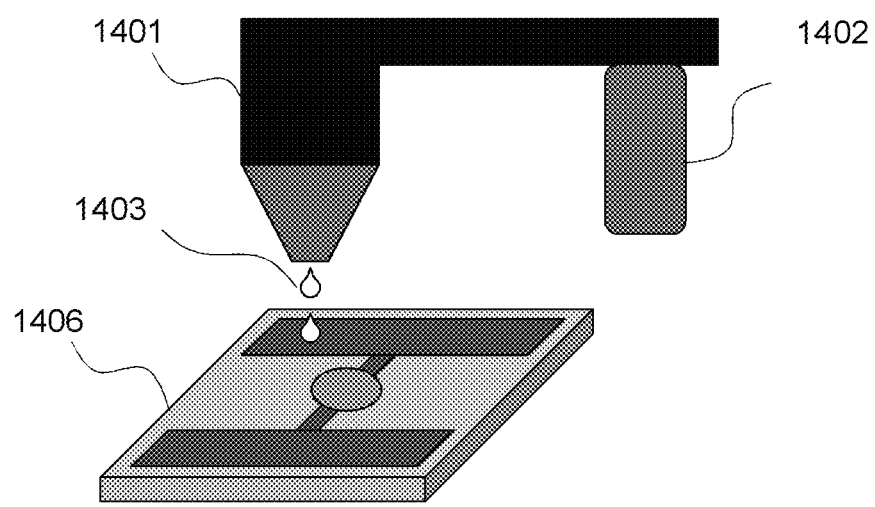

FIG. 14 is a schematic diagram illustrating the process for applying a viscous liquid or gel 1403 from manual, semi-automated, or automated dispenser 1401. A viscous liquid or gel 1403 is delivered by the dispenser 1401 from a storage reservoir 1402. FIG. 14A shows an embodiment where a processed wafer or array of MEMS mirror devices 1404 is moved laterally 1405 with respect to the dispenser 1401, and viscous liquid or gel 1403 is dispensed to the areas required. FIG. 14B shows an embodiment where a singular MEMS device 1406 is located with respect to a dispenser 1401 and viscous liquid or gel 1403 is dispensed to the areas required.

Figure 15A:
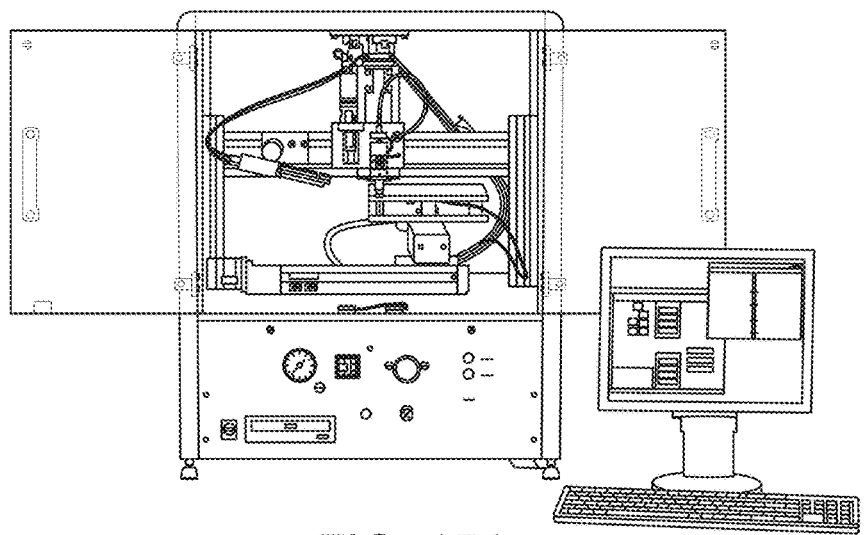
FIG. 15A-15C are photographs illustrating different possible commercially available equipment for dispensing of viscoelastic fluids within wafers or devices according to an aspect of the present disclosure.
Figure 15B:
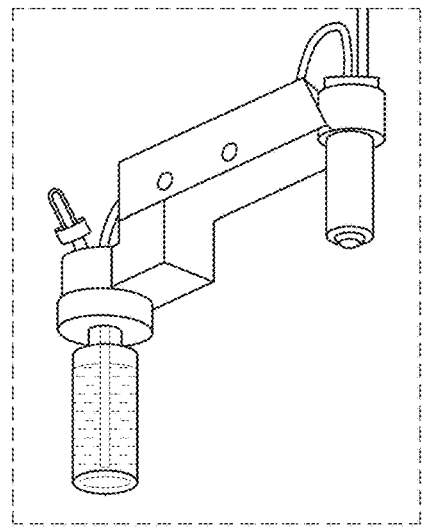
Figure 15C:
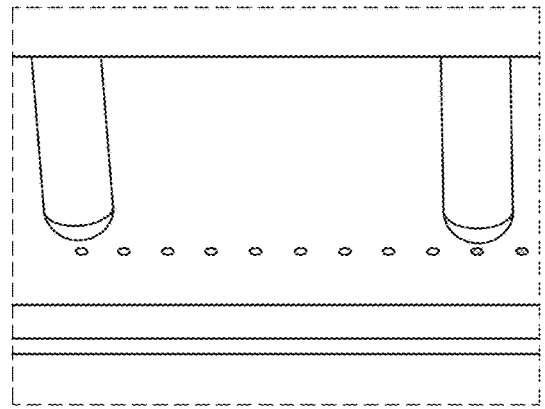

FIG. 15 illustrates a range of dispensing equipment that may be utilized to dispense viscous liquid or gels to enable the temperature and quality factor reductions enabled by the present invention.

Certain aspects of the present disclosure, e.g., those shown in FIG. 6, are described in further detail by Abhishek Kasturi, Veljko Milanovic, and James Yang in "MEMS Mirror Based Dynamic Solid State Lighting Module", Society for Information Display 2016 International Symposium, May 24, 2016, San Francisco, CA, the entire contents of which are incorporated herein by reference and included below as Appendix A.

Additional aspects of the present disclosure are described in further detail by Veljko Milanovid, Abhishek Kasturi, James Yang, Yu Roger Su, Frank Hu in "Novel Packaging Approaches for Increased Robustness and Overall Performance of Gimbal-less MEMS Mirrors", the entire contents of which are incorporated herein by reference and included below as Appendix B.

Additional aspects of the present disclosure are described in further detail by Veljko Milanovid, Abhishek Kasturi, James Yang, Frank Hu in "A Fast Single-Pixel Laser Imager for VR/AR Headset Tracking", the entire contents of which are incorporated herein by reference and included below as Appendix C.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112(f). Although certain process steps may appear in a certain order in the claims, the steps are not required to be carried out in any particular order unless a particular order is otherwise specified by the claim language.

The invention claimed is:

1. A MEMS micromirror device comprising:
a reflective movable mirror;
a surrounding substrate coplanar to the mirror;
a physical gap filled with fluid between the mirror and the surrounding substrate;
finger structures extending radially from a perimeter of the movable mirror into the physical gap, wherein there are no finger structures extending radially inward from the surrounding substrate that interdigitate with the finger structures that extend radially from the perimeter of the mirror.

2. The device of claim 1, wherein the finger structures extending radially from the perimeter of the movable mirror into the physical gap are configured to provide a thermal conduit for additional heat to flow towards the surrounding substrate.

3. The device of claim 1, wherein the finger structures extending radially from the perimeter of the movable mirror into the physical gap are configured to minimize additional mirror mass that can affect the dynamics of the mirror.

4. The device of claim 1 wherein the finger structures extending radially from the perimeter of the movable mirror into the physical gap are configured to reduce a quality factor of the MEMS micromirror device.

5. The device of claim 1, wherein the movable mirror is round in shape.

6. The device of claim 5, wherein the physical gap is annular in shape.

* * * * *